(12) United States Patent
Huang

(10) Patent No.: US 9,548,427 B2
(45) Date of Patent: Jan. 17, 2017

(54) PACKAGE STRUCTURE AND METHOD FOR MANUFACTURING SAME

(71) Applicants: HongQiSheng Precision Electronics (QinHuangDao) Co.,Ltd., Qinhuangdao (CN); FuKui Precision Component (Shenzhen) Co., Ltd., Shenzhen (CN); Zhen Ding Technology Co., Ltd., Tayuan, Taoyuan (TW)

(72) Inventor: Yu-Cheng Huang, New Taipei (TW)

(73) Assignees: Qi Ding Technology Qinhuangdao Co., Ltd., Qinhuangdao (CN); Zhen Ding Technology Co., Ltd., Tayuan, Taoyuan (TW)

( * ) Notice: Subject to any disclaimer, the term of this patent is extended or adjusted under 35 U.S.C. 154(b) by 0 days.

(21) Appl. No.: 14/864,585

(22) Filed: Sep. 24, 2015

(65) Prior Publication Data
US 2016/0351753 A1    Dec. 1, 2016

(30) Foreign Application Priority Data

May 26, 2015    (CN) .......................... 2015 1 0274079

(51) Int. Cl.
| H01L 33/46 | (2010.01) |
| --- | --- |
| H01L 33/48 | (2010.01) |
| H01L 33/62 | (2010.01) |
| H01L 33/52 | (2010.01) |
| H01L 33/56 | (2010.01) |

(Continued)

(52) U.S. Cl.
CPC ............. *H01L 33/46* (2013.01); *H01L 33/486* (2013.01); *H01L 33/502* (2013.01); *H01L 33/507* (2013.01); *H01L 33/52* (2013.01); *H01L 33/56* (2013.01); *H01L 33/62* (2013.01); *H01L 33/644* (2013.01); *H01L 33/647* (2013.01); *H01L 2933/005* (2013.01); *H01L 2933/0025* (2013.01); *H01L 2933/0033* (2013.01); *H01L 2933/0066* (2013.01)

(58) Field of Classification Search
None
See application file for complete search history.

(56) References Cited

U.S. PATENT DOCUMENTS

| 6,208,078 B1* | 3/2001 | Fujii | ................... H01L 25/0753 257/E25.02 |
| --- | --- | --- | --- |
| 7,489,076 B2* | 2/2009 | Mitsuyama | ............. H01L 33/60 313/498 |

(Continued)

*Primary Examiner* — Bilkis Jahan
(74) *Attorney, Agent, or Firm* — Zhigang Ma

(57) ABSTRACT

The present disclosure relates to a method for manufacturing a LED package structure. First, a support plate including a top surface is provided. An annular groove is defined on the top surface and a protruding portion on the support plate is surrounded by the annular groove. Second, a reflecting layer is formed on surfaces and periphery portions of the annular groove. Then, a wiring pattern is formed on the top surface corresponding to the protruding portion. An insulting layer is formed in spaces of the wiring pattern and the annular groove. The support plate is removed and a receiving groove is formed by the insulting layer and the corresponding protruding portion. Finally, a LED chip is received in the receiving groove and bonded on the wiring pattern to obtain a LED package structure. A LED package structure made by the above method is also provided.

11 Claims, 8 Drawing Sheets

(51) Int. Cl.
*H01L 33/50* (2010.01)
*H01L 33/64* (2010.01)

(56) References Cited

U.S. PATENT DOCUMENTS

| | | | | |
|---|---|---|---|---|
| 8,115,225 B2* | 2/2012 | Kim | ........................ | H01L 33/60 |
| | | | | 257/98 |
| 2007/0126020 A1* | 6/2007 | Lin | ........................ | H01L 33/486 |
| | | | | 257/100 |
| 2011/0186975 A1* | 8/2011 | Chen | ...................... | H01L 23/495 |
| | | | | 257/676 |
| 2012/0146494 A1* | 6/2012 | Nakayama | .............. | H01L 33/60 |
| | | | | 313/512 |

* cited by examiner

PACKAGE STRUCTURE AND METHOD FOR MANUFACTURING SAME

FIELD

The subject matter herein generally relates to a light emitting diode (LED) package structure.

BACKGROUND

In the field of LEDs, the packaged LED generally includes a LED chip bonded on the substrate. Although the internal efficiency of the LED chip is high, the light output of the packaged LED is limited by the differences of the refraction index between the LED chip and air. The light usage efficiency respect to the energy efficiency of the light emitting from the LED chip is low. A LED package structure with a high reflection substrate is needed for increasing the light efficiency of LEDs.

BRIEF DESCRIPTION OF THE DRAWINGS

Implementations of the present technology will now be described, by way of example only, with reference to the attached figures.

DETAILED DESCRIPTION

Figure 1:
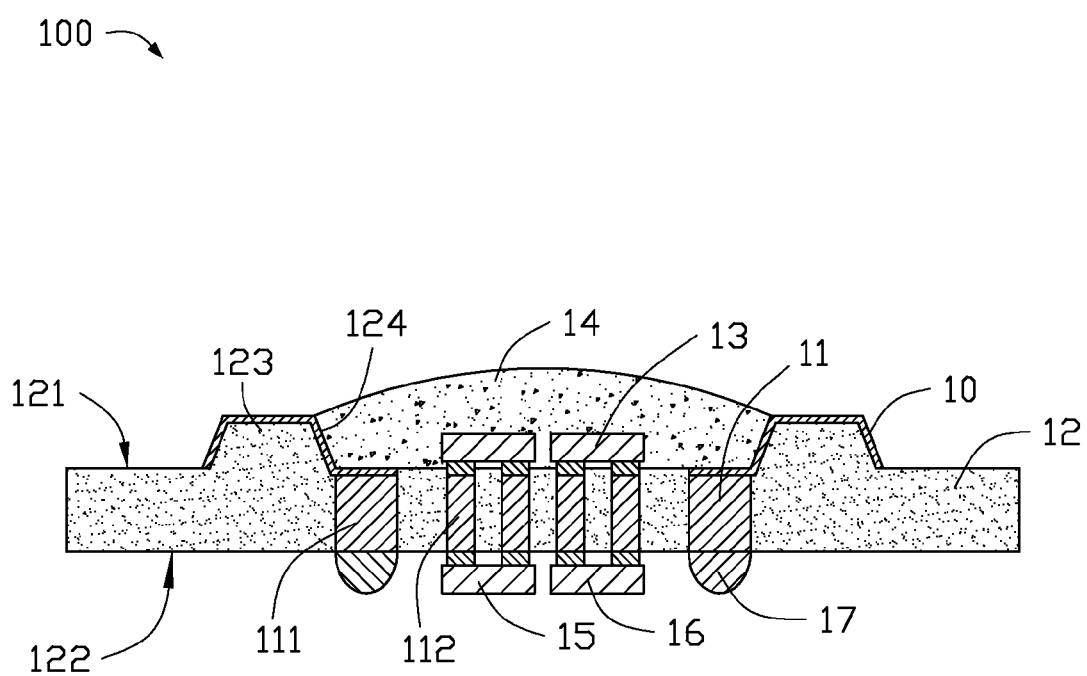
FIG. 1 is a cross sectional view of a LED package structure according to an embodiment of the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein may be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The term "comprising," when utilized, means "including, but not necessarily limited to"; it specifically indicates open-ended inclusion or membership in the so-described combination, group, series, and the like.

FIG. 1 illustrates a LED package structure 100 including an insulating layer 12, a reflective layer 10, a wiring pattern 11, a LED chip 13, and an encapsulation resin 14.

The insulating layer 12 comprises a first surface 121 and a second surface 122 opposite to the first surface 121, the first surface 121 has a surrounding annular protruding portion 123 forming a receiving groove 124. The cross-sections of the annular protruding portion 123 and the receiving groove 124 are trapezoidal shaped. The material of the insulating layer 12 can be epoxy resin, silicone, silicone resin, or Polyphthalamide (PPA). In at least one embodiment, the material of the insulating layer 12 is made of an epoxy molding compound epoxy molding compound (EMC). The bottom of the receiving groove 124 is formed with through holes (not shown) penetrating through the insulating layer 12 to the second surface 122.

The reflective layer 10 is formed on the outer surface of the annular protruding portion 123. The outer surface of the annular protruding portion 123 includes a top surface, an inner oblique side surface, and an outer oblique side surface. In addition, the reflective layer 10 is extended from the inner oblique side surface of the annual protruding portion 123 to the edge of the bottom surface of the receiving groove 124. In at least one embodiment, the reflective layer 10 on the bottom surface of the receiving groove 124 is flush with the first surface 121 of the insulating layer 12. The reflective layer 10 can be a metallic material. The reflective layer 10 can be made of nickel (Ni), nickel-chromium (Ni—Cr), or nickel-gold (Ni—Au).

The wiring pattern 11 is formed on the through holes within the insulating layer 12. The surface of the wiring pattern 11 away from the receiving groove 124 is flush with the second surface 122. The wiring pattern 11 includes a plurality of first conductive blocks 111, a plurality of second conductive blocks 112. In this embodiment, the size of the first conductive block 111 is larger than the size of the second conductive block 112. The first conductive blocks 111 located near the surface of the receiving groove 124 are covered with the reflective layer 10 which is formed on the bottom edge surface of the receiving groove 124. The second conductive blocks 112 have a surface near the receiving groove 124 defining a recess corresponding to the first surface 121. The surfaces of the second conductive blocks 112 near the receiving groove 124 are defined as recessed surfaces corresponding to the first surface 121.

The LED chip 13 with conductive pins (not shown) can be bonded to the surface of the second conductive blocks 112 near the first surface 121 of the insulating layer 12 by soldering. The bottom and surrounding the LED chip 13 are protected by an encapsulation resin 14. The encapsulation resin 14 can be an epoxy resin mixed with phosphors. The amount of the LED chip 13 in a package structure can be one chip or multiple chips. In at least one embodiment, the LED chip 13 is multiple chips and arranged as a LED array or a LED matrix.

Figure 2:
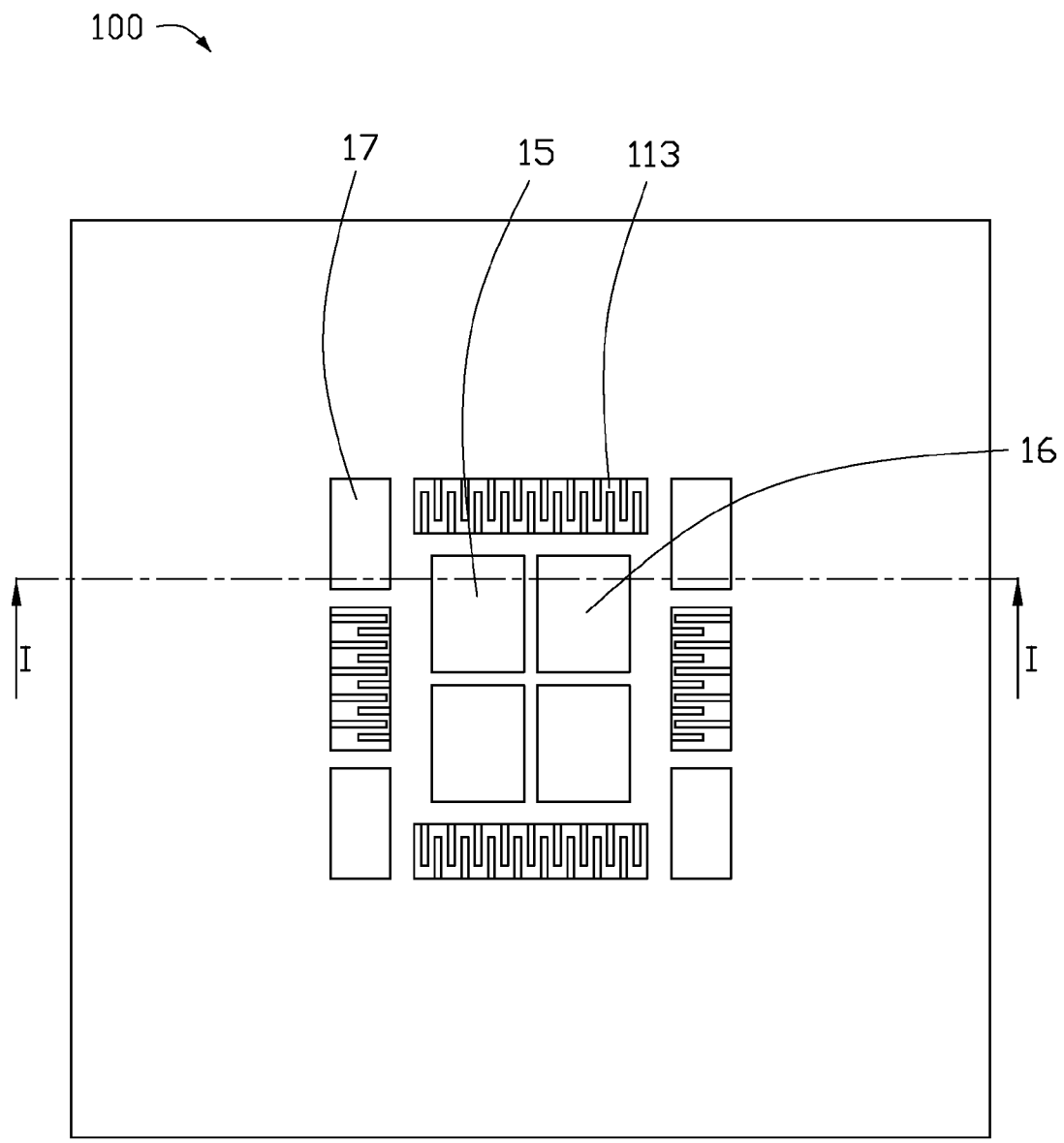
FIG. 2 is a bottom view of a LED package structure in FIG. 1 according to the present disclosure.

FIG. 2 illustrates a driving module 15 and an electrostatic protection module 16 arranged on the back side of the LED package structure 100. The I-I line indicates the location of the cross section of the LED package structure 100 described in FIG. 1. The driving module 15 and the electrostatic protection module 16 are arranged on the surface of the second conductive blocks 112 near the second surface 122 of the insulating layer 12 by soldering as shown in FIG. 1. In addition, a plurality of solder balls 17 are formed on the surface of the first conductive block 111 near the second surface 122 of the insulating layer 12. The wiring pattern 11 formed on the through holes within the insulating layer 12 further includes a plurality of heat dissipation conductive blocks 113 as shown in FIG. 2. The heat dissipation conductive blocks 113 are arranged to define a plurality of heat dissipation channels. The material of the wiring pattern 11 including the first conductive blocks 111, the plurality of second conductive blocks 112, and the plurality of heat dissipation conductive blocks 113, can be copper (Cu). The heat conductive blocks 113 located near the surface of the receiving groove 124 are covered with the reflective layer 10 which is formed on the bottom edge surface of the receiving groove 124.

In other embodiments, the plurality of the heat dissipation conductive blocks 113 can be coupled to form a communicating heat dissipation channel.

FIGS. 3 to 16 illustrate a method of making a LED package structure 100.

FIGS. 3 to 16 are presented in accordance with an example embodiment. The example method shown in FIGS. 3 to 16 is provided by way of example, as there are a variety of ways to carry out the method. The method described below can be carried out using the configurations illustrated in FIGS. 3 to 16, for example, and various elements of these figures are referenced in explaining example method. Each of FIGS. 3 to 16 represents one or more processes, methods or subroutines, carried out in the example method. Furthermore, the illustrated order of FIGS. 3 to 16 is illustrative only and the order of FIGS. 3 to 16 can be changed according to the present disclosure. Additional processes can be added or fewer processes may be utilized, without departing from this disclosure.

Figure 3:
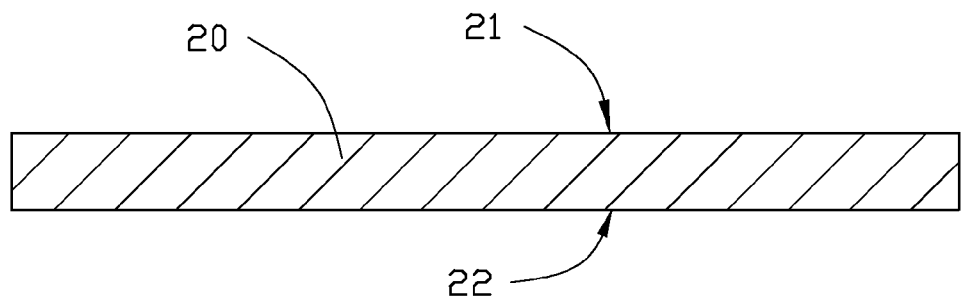
FIG. 3 is a cross sectional view of a support plate of a LED package structure in FIG. 1 according to the present disclosure

FIG. 3 illustrates a support plate 20 provided for making the LED package structure 100. The support plate 20 includes a top surface 21 and a bottom surface 22 opposite to the top surface 21. The support plate 20 is made of at least one metallic material. In at least one embodiment, the material of the support plate 20 is copper.

Figure 4:
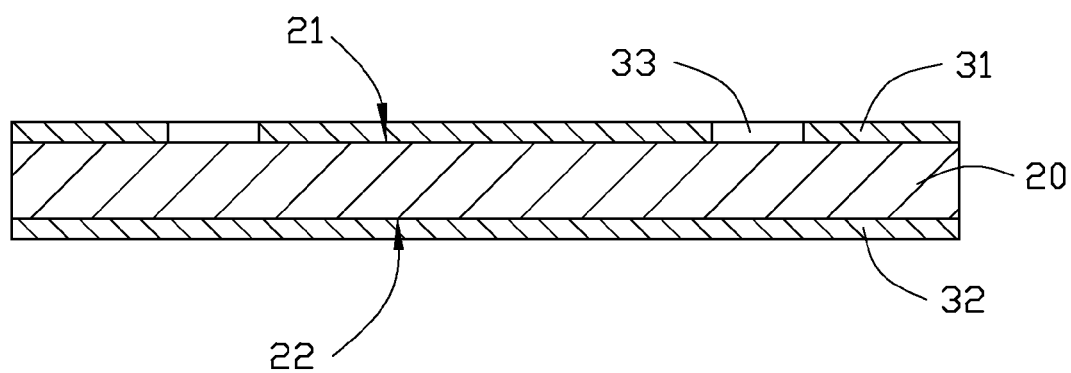
FIG. 4 is a cross sectional view of a support plate in FIG. 3 after forming a first etching resist layer and a second etching resist layer.
Figure 5:
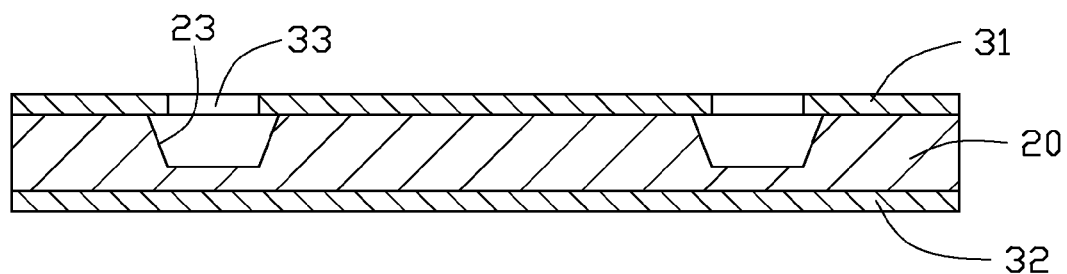
FIG. 5 is a cross sectional view of a support plate in FIG. 4 after forming an annular recess on the support plate
Figure 6:
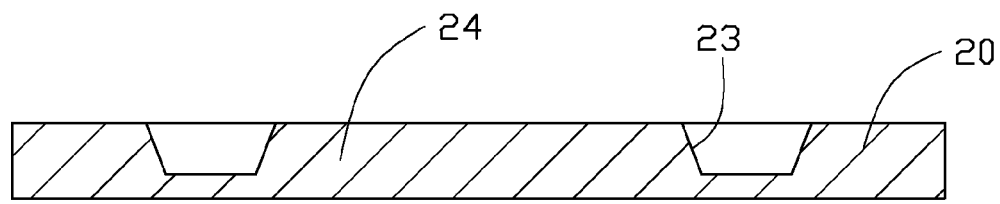
FIG. 6 is a cross sectional view of a support plate in FIG. 5 after removing the first etching resist layer and the second etching resist layer.

FIG. 4 to FIG. 6 illustrate an annular recess 23 formed on the top surface 21 of the support plate 20. The annular recess 23 is recessed from the top surface 21 of the support plate 20 to the inside of the support plate 20.

In at least one embodiment, the annular recess 23 is annular shaped to surround a portion of the support plate 20 for forming a protruding portion 24. The shape of the protruding portion 24 projecting from the annular recess 23 is square or rectangular.

The details of the method for forming the annular recess 23 include the following processes.

FIG. 4 illustrates a first etching resist layer 31 and a second etching resist layer 32 are respectively formed on the top surface 21 and the bottom surface 22 of the support plate 20. The first etching resist layer 31 has an first annular etching opening 33, and a portion of the top surface 21 of the support plate 20 is exposed from the first annular etching opening 33. In this embodiment, both of the first etching resist layer 31 and the second etching resist layer 32 are dry film. After exposure and development, a portion of the first etching resist layer 31 and the second etching resist layer 32 are removed to obtain the first annular etching opening 33.

FIG. 5 illustrates the support plate 20 is etched by the chemical etching solution to form the annular recess 23. The surface of the support plate 20 not covered with the first etching resist layer 31 and the second etching resist layer 32, corresponding to the first annular etching opening 33, is etched to form the annular recess 23. In at least one embodiment, the width of the annular recess 23 is decreased with a direction from the top surface 21 to the bottom of the annular recess 23. The cross section of the annular recess 23 is substantially a trapezoidal shape. In addition, the opening of the annular recess 23 on the top surface 21 has a width larger than the width of the first annular etching opening 33.

FIG. 6 illustrates the support plate 20 with the annular recess 23 and the protruding portion 24 after removal of the first etching resist layer 31 and the second etching resist layer 32.

In other embodiments, a plurality of annular recesses 23 can be formed on the support plate 20 by laser ablation, mechanical drilling, or other methods.

Figure 7:
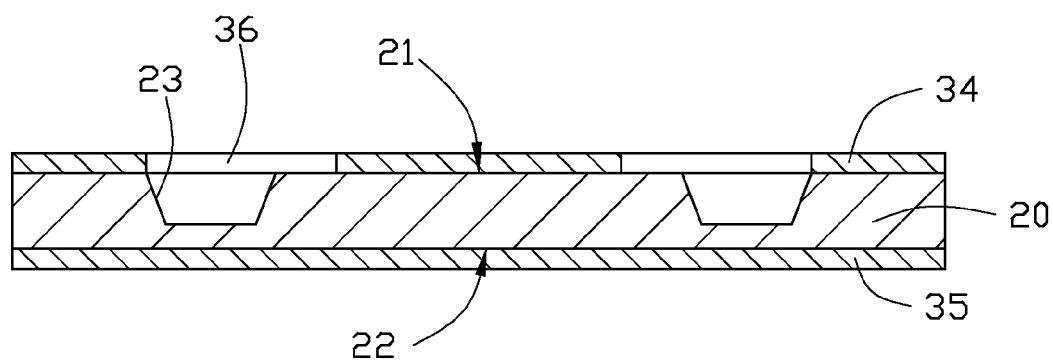
FIG. 7 is a cross sectional view of a support plate in FIG. 6 after forming a first protection layer and a second protection layer.
Figure 8:
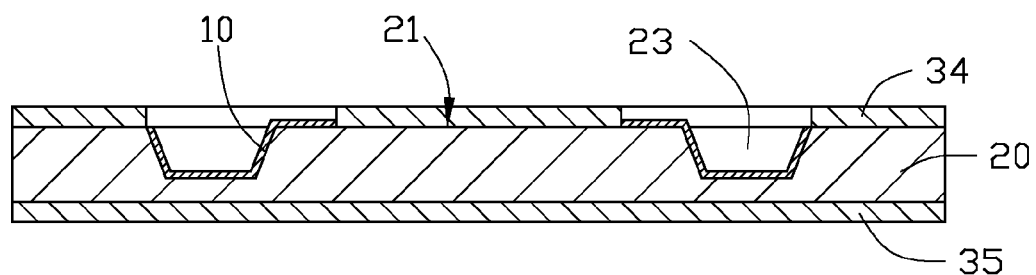
FIG. 8 is a cross sectional view of a support plate in FIG. 7 after forming a reflective layer.
Figure 9:
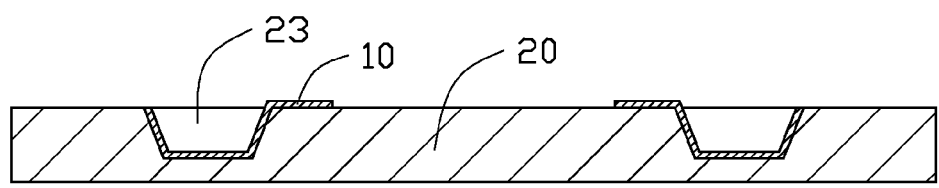
FIG. 9 is a cross sectional view of a support plate in FIG. 8 after removing the first protection layer and the second protection layer.

FIG. 7 to FIG. 9 illustrate a reflective layer 10 formed on the bottom and side surfaces of the recess 23, and formed on a portion of the top surface 21 located on the protruding portion 24 near the annular recess 23.

The details of the method for forming the reflective layer 10 include the following processes.

FIG. 7 illustrates that a first protection layer 34 and a second protection layer 35 are respectively formed on the top surface 21 and the bottom surface 22. The first protection layer 34 defines a first annular opening 36. In at least one embodiment, the first protection layer 34 and the second protection layer 35 are dry film. After exposure and development, a portion of the first protection layer 34 is removed and the first annular opening 36 is obtained. The annular recess 23 and the top surface 21 located on the protruding portion 24 near the annular recess 23 are exposed from the first annular opening 36.

FIG. 8 illustrates that a reflective layer 10 is formed on the top layer 21 and the bottom and side surfaces of the annular recess 23 which are exposed from the first annular opening 36. The method for forming the reflective layer 10 can be electroplating, sputtering, chemical plating, and other methods. In at least one embodiment, the reflective layer 10 has a reflective surface to reflect the incident light.

FIG. 9 illustrates the support plate 20 with the reflective layer 10 formed on the annular recess 23 and a portion of the surface of the protruding portion 24 near the annular recess 23 after removing the first protection layer 34 and the second protection layer 35.

FIG. 10 to FIG. 13 illustrate that a wiring pattern 11 is formed on the protruding portion 24. The wiring pattern 11 includes a plurality of first conductive blocks 111, a plurality of second conductive blocks, and a plurality of heat dissipation conductive blocks 113. The plurality of first conductive blocks 111 and the plurality of heat dissipation conductive blocks 113 are formed on a portion of the surface of the reflective layer 10 which is positioned on the protruding portion 24 near the annular recess 23, and the second conductive blocks 112 are formed on a portion of the top surface of 21 which is not covered with the reflective layer 10. The method for forming the wiring pattern 11 includes the following processes.

Figure 10:
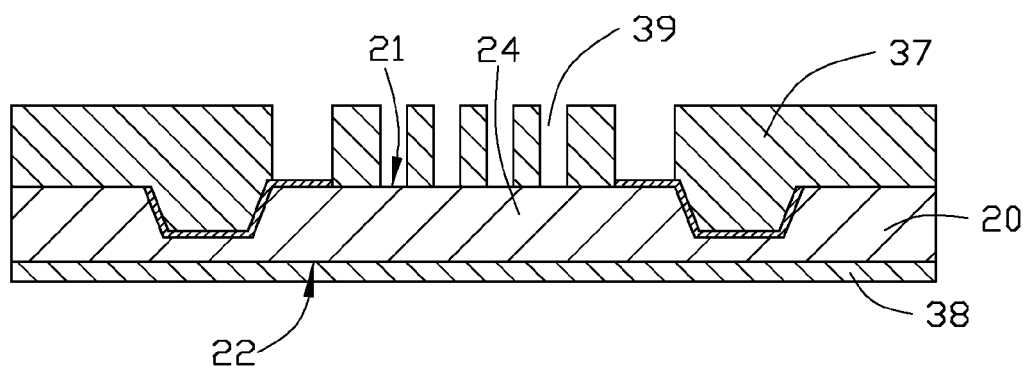
FIG. 10 is a cross sectional view of a support plate in FIG. 9 after forming a third protection layer and a fourth protection layer.

FIG. 10 illustrates that a third protection layer 37 and a fourth protection layer 38 are respectively formed on the top surface 21 and the bottom surface 22. The third protection layer 37 covers a portion of the top surface 21 and fills in the annular recess 23. The third protection layer 37 defines a plurality of second openings 39, and a portion of the protruding portion 24 is exposed from the second openings 39. The third protection layer 37 with the second openings 39 is used as a mask layer for forming the wiring pattern 11. In at least one embodiment, the third protection layer 37 and the fourth protection layer are dry film. After exposure and developing, a portion of the third protection layer 37 is removed to obtain the plurality of second openings 39. In at least one embodiment, the thickness of the third protection layer 37 is larger than the thickness of the fourth protection layer 38.

Figure 11:
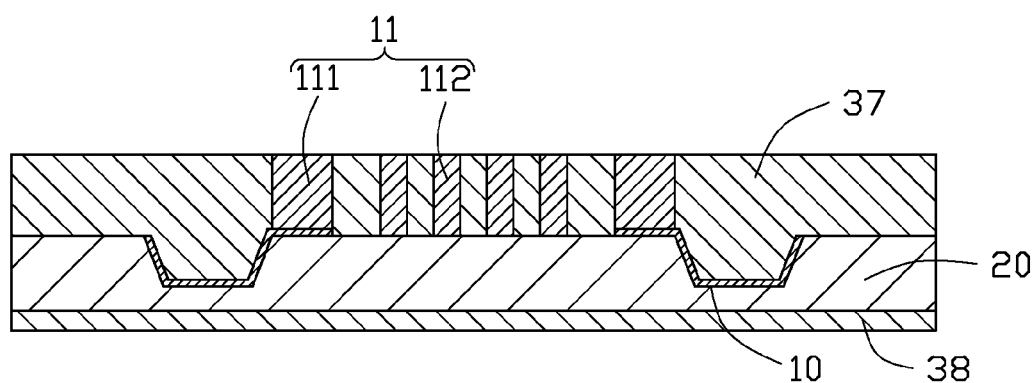
FIG. 11 is a cross sectional view of the support plate in FIG. 10 after forming a wiring pattern.
Figure 12:
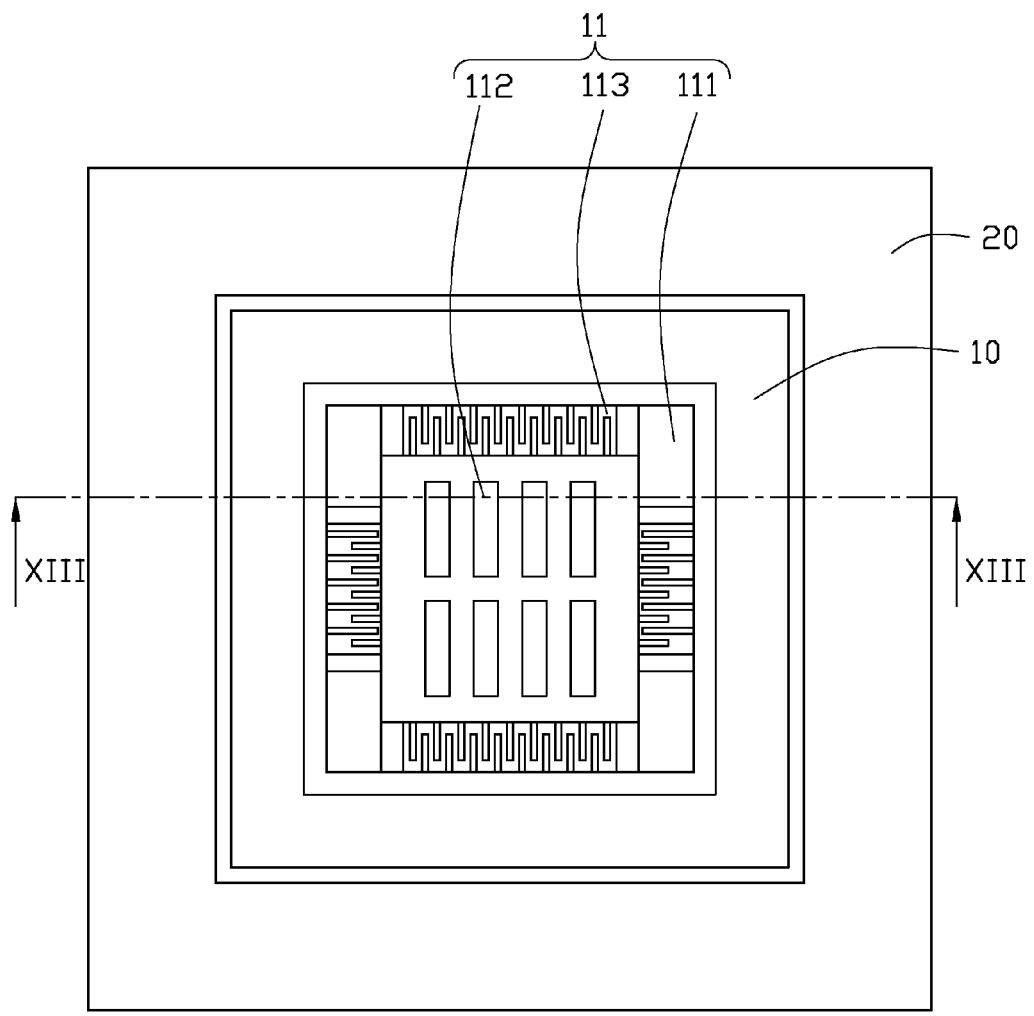
FIG. 12 is a top view of the support plate in FIG. 10 after forming a wiring pattern.

FIG. 11 and FIG. 12 illustrate the wiring pattern 11 is formed on the top surface 21 and the reflective layer 10 which are exposed from the second openings 39 by a coating method. The coating method for forming the wiring pattern 11 can be electroplating, support, and chemical plating, and other methods.

Figure 13:
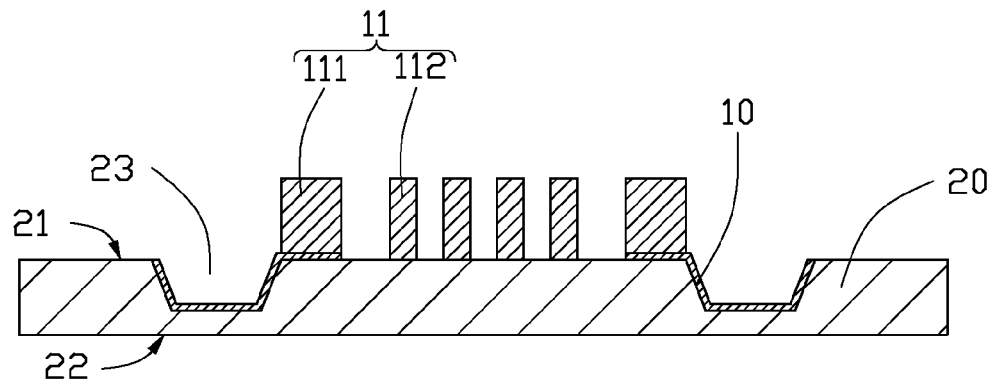
FIG. 13 is a cross sectional view of a support plate in FIG. 12 after removing the third protection layer and the fourth protection layer.

FIG. 13 illustrates the cross section of the support plate 20 with the wiring pattern 11 along the XIII-XIII line in FIG. 12 after the removal of the third protection layer 37 and the fourth protection layer 38.

In other embodiments, the wiring pattern 11 can be obtained by directly screen printing the conductive paste on the protruding portion 24 and curing the conductive paste without forming the third protection layer 37 and the fourth protection layer 38.

Figure 14:
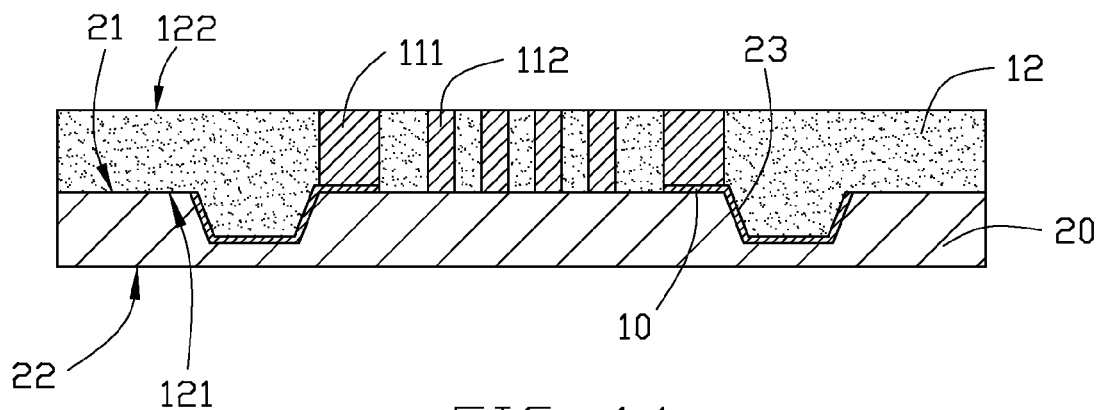
FIG. 14 is a cross sectional view of a support plate in FIG. 13 after forming an insulating layer.

FIG. 14 illustrates an insulating layer 12 formed on the top surface 21 of the support plate 20. The insulating layer 12 is filled in the annular recess 23 and the gaps within the wiring pattern 11 which are positioned between the plurality of first conductive blocks 111 and the plurality of second conductive blocks 112.

The insulating layer 12 includes a first surface 121 and a second surface 122 opposite to the first surface. The first surface 121 of the insulating layer 12 contacts with the top surface 21 and the second surface 122 of the insulating layer 12 is flush with the surface of the wiring pattern 11 away from the support plate 20. In at least one embodiment, the method for forming the insulating layer 12 includes the following processes.

First, a mold (not shown) is provided to load the support plate 20 with the wiring pattern 11. After loading the support plate 20, the epoxy molding compound is injected into the cavity of the mold to cover the top surface 21 of the support plate 20, and is filled in the annular recess 23 and the gaps within the wiring pattern 11. Thereby, the epoxy molding compound is cured to form the insulating layer 12.

After forming the insulating layer 12, the surface of the insulating layer 12 away from the support plate 20 is ground. The second surface 122 of the insulating layer 12 is ground to be flush with the surface of the wiring pattern 11 away from the support plate 20. Therefore, the first conductive blocks 111 and the second conductive blocks 112 are exposed to the insulating layer 12.

Figure 15:
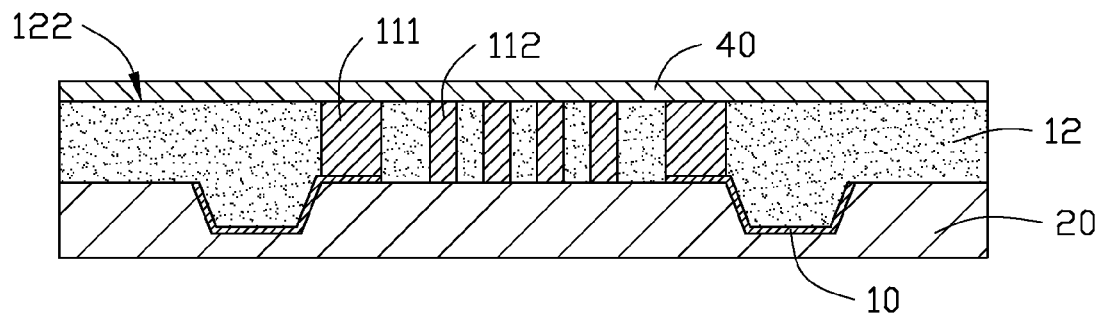
FIG. 15 is a cross sectional view of a support plate after forming the third etching resist layer.
Figure 16:
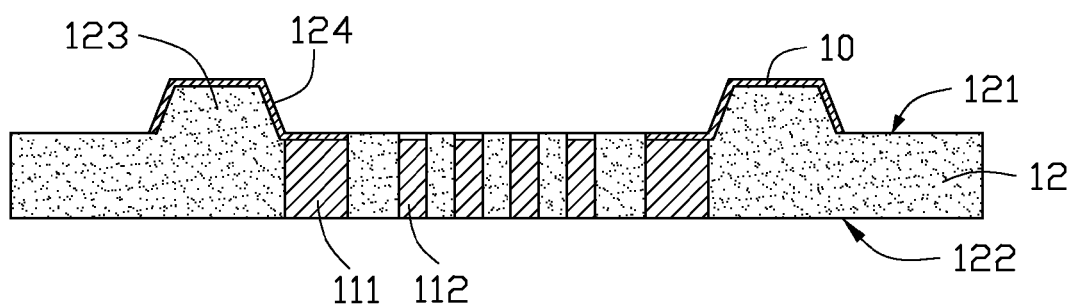
FIG. 16 is a cross sectional view of a support plate in FIG. 15 after removing the third etching resist layer.

FIG. 15 and FIG. 16 illustrate that the reflective layer 10 and the wiring pattern 11 not covered with the reflective layer 10 are exposed after removing the support plate 20.

In at least one embodiment, an annular protruding portion 123 is formed in the insulating layer 12 corresponding to the annular recess 23. The annular protruding portion 123 is formed to surround a receiving groove 124. The cross sections of the annular protruding portion 123 and the receiving groove 124 are trapezoidal shaped. The reflective layer 10 is formed on the top and side surfaces of the annular protruding portion 123 and on the edge of the bottom surface of the receiving groove 124.

In at least one embodiment, the method for removing the support plate 20 includes the following processes.

FIG. 15 illustrates a third etching resist layer 40 laminated on the second surface 122 of the insulating layer 12.

FIG. 16 illustrates that the support plate 20 is removed by a chemical solution. The chemical solution can be a copper etching solution. The support plate 20 is used as a dummy substrate or a scarifying substrate. In at least one embodiment, the materials used for the insulating layer 12 and the reflective layer 10 are different from the material used for the support plate 20. Therefore, the insulating layer 12, the reflective layer 10, and the wiring pattern 11 covered with the reflective layer 10 are not etched by the chemical solution, and the wiring pattern 11 not covered with the reflective layer 10 is partially etched in the thickness direction. And then, the third etching resist layer 40 is removed.

After removing the third resist layer 40, a LED package substrate is obtained.

FIG. 1 and FIG. 2 illustrate when packaging a LED chip 13 on the LED package substrate mentioned above, the LED chip 13 with conductive pins is bonded on the surface of the second conductive blocks 112 exposed from the bottom surface of the receiving groove 124 by soldering. The LED chip 13 is received in the receiving groove 124. In addition, a driving module 15 and an electrostatic protection module 16 are bonded on the surface of the second conductive blocks 112 away from the receiving groove 124. The bottom and surrounding of the LED chip 13 are protected by an encapsulation resin 14. A LED package structure is obtained after curing the encapsulation resin 14. The encapsulation resin 14 can contain the fluorescence powders for light wavelength conversion.

In at least one embodiment, the method for manufacturing the LED package structure 100 removes the support plate 20 after adding layers on the support plate 20. The manufacturing method is simplified and stable. The reflective layer 10 of the LED package structure 100 is flush with the insulating layer 12 to effectively reduce the thickness of the LED package structure 100. In addition, the reflective layer 10 formed on the side surfaces of the receiving groove 124 and the edge of the bottom surface of the receiving groove 124 increases the light reflection efficiency, and the light efficacy of the LED package structure 100 is increased with the increase of the reflection efficiency.

In at least one embodiment, the wiring pattern 11 is formed by the first conductive blocks 111, the second heat conductive blocks 112, and the heat dissipation conductive blocks 113. The heat dissipation conductive blocks 113 are coupled as a communicating heat dissipation channel to effectively dissipate the heat and increase the luminous efficacy of the LEDs. Because the heat dissipation channel is a portion of the conductive pattern 11 without designing additional extra cooling structures, the wiring pattern 11 not only saves production and material costs, but also reduces the thickness of the LED package structure 100. In addition, the epoxy molding compound is used to replace the traditional ceramic and Bismaleimide-Triazine (BT Epoxy) as the insulating layer 10 and effectively reduces the material costs.

The embodiments shown and described above are only examples. Many details are often found in the art such as the other features of a LED package structure. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, especially in matters of shape, size, and arrangement of the parts within the principles of the present disclosure, up to and including the full extent established by the broad general meaning of the terms used in the claims. It will therefore be appreciated that the embodiments described above may be modified within the scope of the claims.

What is claimed is:

1. A method of manufacturing a LED packaging structure comprising:
   providing a support plate to be used as a substrate, the support plate includes a top surface and a bottom surface opposite to the top surface, the support plate further includes an annular recess formed on the top surface, a portion of the support plate surrounded by the annular recess is formed as a protruding portion;
   forming a reflective layer on the surface of the annular recess and the edge of the protruding portion near the annular recess;
   forming a wiring pattern on the top surface of the protruding portion;
   forming an insulating layer to fill in the gaps of the wiring pattern and to fill in the annual recess;
   forming a receiving groove on the position of the insulating layer corresponding to the position of the protruding portion after removing the support plate; and
   accommodating a LED chip in the receiving groove, the LED chip with conductive pins are bonded on the wiring pattern by solder balls.

2. The method of manufacturing a LED package structure of claim 1, wherein the method for forming an annular recess further comprises:
   forming a first etching resist layer and a second etching resist layer respectively on the top surface and the bottom surface of the support plate, the first etching resist layer includes a first etching opening, and a portion of the top surface of the support plate not covered with the first etching resist layer, which is corresponding to the top surface of the support plate exposed from the first etching opening, is etched to form the annular recess; and
   removing the first etching resist layer and the second etching resist layer, wherein the cross section of the annular recess is trapezoidal shaped;
wherein the width of the annular recess is gradually decreased in a direction from the opening of the annular recess to the bottom of the annular recess;
wherein the width of the opening for the annular recess on the top surface is larger than the width of the first etching opening.

3. The method of manufacturing a LED package structure of claim 1, wherein the method for manufacturing the annular recess is laser ablation, wherein the cross section of the annular recess is trapezoidal shaped, and the width of the opening for the annular recess on the top surface is gradually decreased in a direction from the opening of the annular recess to the bottom of the annular recess.

4. The method of manufacturing a LED packaging structure of claim 1, wherein the material of the reflective layer is made of nickel, nickel-gold, or nickel-chromium, and the method for forming the reflective layer further comprising:
   forming a first protection layer and a second protection layer respectively on the top surface and the bottom surface of the support plate, the first protection layer defines a first annular opening, the annular recess and the top surface of the protruding portion near the annular recess are exposed from the first annular opening;
   forming the reflective layer on the top surface of the support plate exposed from the first annular opening and on the bottom and side surfaces of the annular recess; and
   removing the first protection layer and the second protection layer.

5. A method of manufacturing a LED package structure of claim 1, wherein the method for forming the wiring pattern comprises:
   forming a third protection layer and a fourth protection layer respectively on the top surface and the bottom surface, the third protection layer covers a portion of the top surface and fills in the annular recess, the third protection layer defines a plurality of second openings and a portion of the protruding portion is exposed from the second openings which is corresponding to the wiring pattern;
   plating the wiring pattern on the top surface and the surface of the reflective layer which are exposed from the plurality of second openings by a coating method; and
   removing the third protection layer and the fourth protection layer;
wherein the coating method for the wiring pattern is selected from one of electroplating, sputtering, or chemical plating.

6. The method of manufacturing a LED package structure of claim 1, wherein the material of the insulating layer is an epoxy molding compound, the method for forming the insulating layer comprises:
   placing the support plate with the wiring pattern into a mold;
   injecting the epoxy molding compound into the mold for covering the top surface of the supporting plat and filling in the annular recess and the gaps of the wiring pattern;
   curing the epoxy molding compound; and
   grinding the surface of the epoxy molding compound away from the support plate for forming the insulating layer,
wherein the surface of the insulating layer away from the support plate is flush with the surface of the wiring pattern away from the support plate and the wiring pattern is exposed to the insulating layer.

7. The method of manufacturing a LED package structure of claim 1, wherein the method for removing the support plate comprises:
   laminating a third etching resist layer on one surface of the insulating layer away from the support plate;
   removing the support plate by etching, wherein the insulating layer, the reflective layer and the wiring pattern covered by the reflective layer are not etched, and a portion of the wiring pattern not covered with the reflective layer is etched in a direction of thickness; and
   removing the third etching resist layer.

8. The method of manufacturing a LED package structure of claim 1, wherein the method after accommodating the LED chip in the receiving groove and bonding the LED chip to the wiring pattern further comprises:

Encapsulating the bottom and surrounding of the LED chip with an encapsulation resin containing fluorescent powders for the light wavelength conversion.

9. A method of manufacturing a LED package structure of claim 1, wherein the wiring pattern includes a plurality of first conductive blocks and a plurality of second conductive blocks, the plurality of first conductive blocks are formed on a portion of the surface of the reflective layer positioned on the protruding portion near the annular recess, the second conductive blocks are formed on the top surface of the support plate corresponding to the surface of the protruding portion not covered with the reflective layer.

10. The method of manufacturing a LED packaging structure of claim 9, wherein the LED chip with conductive pins is bonded to the second conductive blocks, after soldering the LED, the method for manufacturing a LED package structure further comprises:
    bonding a driving module and an electrostatic protection module to the second conductive blocks away from the receiving groove by soldering; and
    forming the solder balls on the surfaces of the first conductive blocks away from the receiving groove.

11. The method of manufacturing a LED package structure of claim 9, wherein the wiring pattern further comprises a plurality of heat dissipation conductive blocks, the plurality of heat dissipation conductive blocks are formed on a portion of the surface of the reflective layer positioned on the protruding portion near the annular recess, and the plurality of the heat dissipation conductive blocks form a plurality of heat dissipation channels.

* * * * *